United States Patent [19]
Hirose

[11] Patent Number: 5,598,405
[45] Date of Patent: Jan. 28, 1997

[54] TIME DIVISION MULTIPLE ACCESS TIME DIVISION DUPLEX TYPE TRANSMITTER-RECEIVER

[75] Inventor: Yoshitaka Hirose, Soma, Japan

[73] Assignee: Alps Electric Co., Ltd., Tokyo, Japan

[21] Appl. No.: 377,571

[22] Filed: Jan. 23, 1995

[30] Foreign Application Priority Data

Jan. 25, 1994 [JP] Japan .................................. 6-006482
Jan. 25, 1994 [JP] Japan .................................. 6-006483

[51] Int. Cl.$^6$ .................................................. H03L 7/06
[52] U.S. Cl. ................... 370/280; 375/375; 375/376; 327/156; 331/25; 370/347
[58] Field of Search ........................... 370/29, 32, 24, 370/93, 105.3, 110.1, 95.1, 95.2; 455/84, 86, 87, 75, 76, 77, 181.1, 152.1, 180.3, 260; 331/14, 17, 18, 25; 375/219, 220, 371, 373, 375, 376; 327/141–164

[56] References Cited

U.S. PATENT DOCUMENTS

| | | | |
|---|---|---|---|
| 4,083,015 | 4/1978 | Popodi | 331/4 |
| 5,123,008 | 6/1992 | Beesley | 370/29 |
| 5,140,286 | 8/1992 | Black et al. | 455/87 |
| 5,153,530 | 10/1992 | Takagi et al. | 331/17 |
| 5,175,511 | 12/1992 | Fujiwara | 331/18 |
| 5,230,088 | 7/1993 | Kramer | 455/84 |
| 5,337,010 | 8/1994 | Nishiyama | 330/255 |
| 5,339,309 | 8/1994 | Saito | 370/32 |
| 5,465,400 | 11/1995 | Norimatsu | 455/127 |
| 5,521,947 | 5/1996 | Madsen | 327/156 |

*Primary Examiner*—Alpus H. Hsu
*Assistant Examiner*—Seema S. Rao
*Attorney, Agent, or Firm*—Guy W. Shoup; Patrick T. Bever

[57] ABSTRACT

A transmitter-receiver of the TDMA/TDD type which includes a phase control loop controlled in such a manner that the loop is turned on during the time slot just preceding each of a transmission time slot and a reception time slot, and the loop is turned off during all other time periods including the transmission time slot and the reception time slot. The voltage controlled oscillator includes a variable capacitance diode which produces an output frequency in response to a frequency control voltage received from a charge pump when the loop is closed, and in response to a charging voltage supplied from a loop filter when the loop is open. When the loop is closed, a phase comparator compares a reference frequency signal with an output frequency signal of the voltage-controlled oscillator and generates error signals for controlling the charge pump. A state switching unit switches the state of the phase comparator between an operating state, when the loop is closed, and a stand-by state in response to a power saving signal when the loop is open. A bias supply unit applies a variable bias voltage to an anode of the variable capacitance diode. The variable bias voltage varies in nearly the same manner as the charging voltage supplied to a cathode of the variable capacitance diode from the loop filter when the phase comparator is in a stand-by state, thereby maintaining the voltage across the variable capacitance diode at a relatively constant level such that the output frequency signal is maintained at a desired level.

7 Claims, 6 Drawing Sheets

TIME DIVISION MULTIPLE ACCESS TIME DIVISION DUPLEX TYPE TRANSMITTER-RECEIVER

BACKGROUND OF THE INVENTION

1. Field of The Invention

The present invention generally relates to a time division multiple access/time division duplex (hereunder abbreviated as TDMA/TDD) type transmitter-receiver and more particularly to a TDMA/TDD type transmitter-receiver in which a voltage-controlled oscillator (hereunder sometimes abbreviated as VCO) of a phase control loop (namely, a phase-locked loop (hereunder sometimes abbreviated as PLL)) acts as a carrier oscillator at the time of a transmission and also acts as a local oscillator at the time of a reception.

2. Description of The Prior Art

Generally, in a cordless telephone system employing a TDMA/TDD method, for example, in a DECT (namely, Digital European Cordless Telephone) type digital cordless telephone system employed in Europe, a frame having a frame period (or frame time) of 10 milliseconds for channels is divided into 24 time slots with respect to time (thus one time slot is about 417 microseconds (μs)). Among these time slots, two time slots are employed as communication slots. Further, one of these speech slots is employed as a master slot to be used for a transmission from a transmitter-receiver (hereunder referred to as a master set) serving as a master telephone set (namely, a base unit) to another transmitter-receiver (hereunder referred to as a slave set) serving as a slave cordless telephone set. The other is employed as a slave slot to be used for a transmission from the slave set to the master set. Thus a desired communication or call is made between the master and slave sets. In this case, the master slot and the slave slot are interspersed at an interval of twelve time slots. For instance, in case where a first time slot is used as a master slot, a thirteenth time slot is used as a slave slot.

Further, in case where a call is made between the master set and the slave set, the master set determines which channel should be used and which of time slots corresponding to the determined channel should be used, correspondingly to each frame. On the other hand, the slave set monitors all of the channels and all of the time slots corresponding to each channel at all times other than a period of time assigned to communication slots to be used for the slave set itself. Further, after a speech signal representing a message or speech is converted into digital signal and further a time base compression is performed on this digital signal in the calling set, the compressed signal is transmitted therefrom to the called set whereupon the compressed signal is expanded and subsequently, the expanded signal is converted into an analog signal representing the original message or speech. Thus, substantially bidirectional simultaneous telecommunications can be achieved.

Each transmitter-receiver (namely, each of the master and slave sets) employed in such a cordless telephone system needs to be provided with two oscillators which are respectively used for a transmission and a reception. Especially, because of the fact that there have been demands for reduction in weight, power consumption and cost of the slave set, a PLL oscillation circuit (namely, a PLL synthesizer oscillation circuit) constituted by a single PLL having a VCO is used in the slave set both as a local oscillator for reception and a carrier oscillator for transmission.

However, if a PLL oscillation circuit is used both for a transmission and a reception, the frequency of oscillation of the VCO should be changed when the role of the PLL oscillation circuit is changed from a local oscillator to a carrier oscillator. Further, in the case of a DECT digital cordless telephone system, a time slot just preceding each of transmission and reception time slots is employed as a lock-up time required for changing the role of the PLL oscillation circuit. Therefore, a PLL of the high-speed lock-up type (namely, a PLL, of which the lock-up time constant is reduced by decreasing what is called the CR time constant of a loop filter) is employed in the PLL oscillation circuit of each transmitter-receiver.

Here, FIG. 3 is a schematic block diagram for illustrating the configuration of a TDMA/TDD type transmitter-receiver. FIG. 4 is a circuit diagram for showing the detailed configuration of an example of a known oscillation circuit employed in the transmitter-receiver of FIG. 3.

In FIG. 3, reference numeral 1 designates a phase control loop integrated circuit (namely, a phase-locked loop integrated circuit (hereunder abbreviated as PLL IC)); 2 a charge pump circuit; 3 a loop filter; 4 a VCO (namely, a voltage-controlled oscillator); 5 a crystal oscillator; 6 a variable bias voltage supply circuit; 35 a prescaler; 36 a PLL control circuit; 38 a CPU (namely, a microcomputer control unit); 39 a transmit/receive switch; 40 an RF receiving amplifier; 41 a receiving filter; 42 a frequency converter; 43 an intermediate frequency filter; 44 an intermediate frequency amplifier; 45 a demodulator; 46 a transmitting filter; 47 a power amplifier; 48 a Gaussian filter; 49, 50 and 51 amplifiers; 52 a signal output terminal; and 53 a signal input terminal. Incidentally, note that the variable bias voltage supply circuit 6 is not provided in a known TDMA/TDD type transmitter/receiver but is added to or provided in a TDMA/TDD type transmitter/receiver of the present invention, which will be described later.

Further, in FIG. 4, reference numeral 7 denotes a power terminal; 8 a charge pump feeding terminal; 9 a PLL clock signal terminal; 10 a PLL strobe signal terminal; 11 a PLL data signal terminal; 12 a power saving (hereunder sometimes abbreviated as PS) signal terminal; 13 a modulation signal terminal; 14 a lock detection signal terminal; 15 an RF signal terminal; 16 a pull-up PNP transistor; 17 a pull-down NPN transistor; 18, 29 and 32 capacitors; 19, 27, 28, 30 and 31 resistors; and 20 a variable capacitance diode. Moreover, in this figure, like reference characters designate like or corresponding composing elements of FIG. 3.

Furthermore, as illustrated in FIG. 3, the PLL IC 1 contains the prescaler 35 and the PLL control circuit 36. This PLL control circuit 36 contains a phase comparator (not shown) for comparing the phase of a reference frequency signal supplied from the crystal oscillator 5 with that of an oscillation signal supplied from the VCO 4 through the prescaler 35 and for generating error signals φp and φr and also contains a variable frequency divider (not shown) adapted to change a frequency division ratio according to PLL data (see "PLL DATA" in FIG. 4) supplied from the CPU 38. A loop circuit portion consisting of the PLL IC 1, the charge pump circuit 2, the loop filter 3 and the VCO 4 composes a PLL synthesizer oscillation circuit. Further, a circuit portion consisting of the transmit/receive switch 39, the RF receiving amplifier 40, the receiving filter 41, the frequency converter 42, the intermediate frequency filter 43, the intermediate frequency amplifier 44, the demodulator 45 and the signal output terminal 52 constitutes a receiving circuit. Moreover, another circuit portion consisting of the amplifier 51, the transmitting filter 46 and the power amplifier 47 makes up a transmitting circuit. Additionally, a reception signal is supplied from the demodulator 45 to the signal output terminal 52 and on the other hand, a transmission signal is supplied from the signal input terminal 53 to the modulation signal terminal 13 (see FIG. 4) of the VCO 4. The CPU 38 supplies to the PLL control circuit 36 various signals including a PS signal.

Furthermore, as shown in FIG. 4, the charge pump circuit 2 has the PNP transistor 16 and the NPN transistor 17. The error signals φp and φr are supplied from the PLL control circuit 36 to the bases of these transistors. Further, the connection point between the transistors 16 and 17 forms an output terminal. The loop filter 3 has the capacitor 18 and the resistor 19 which are connected in series with each other. One of terminals of this series circuit is connected to the output terminal of the charge pump circuit 2 and is also connected to the output terminal of the loop filter 3 through the series resistance or resistor 27. On the other hand, the other terminal of the series circuit is grounded. The VCO 4 has the variable capacitance diode 20. Further, the cathode of the diode 20 is connected to the oscillation circuit of the VCO 4 through the series capacitor 29, and the output terminal of the loop filter 3 through the series resistor 28. On the other hand, the anode of the diode 20 is connected to the modulation signal terminal 13 through the resistor 30 and is further grounded through a parallel circuit composed of the resistor 31 and the capacitor 32. The PLL IC 1 is connected to the PLL clock signal terminal 9, the PLL strobe signal terminal 10, the PLL data signal terminal 11, the power saving signal terminal 12, the lock detection signal terminal 14 and the RF signal terminal 15. Moreover, the PLL IC 1 is also connected to the output terminal of the VCO 4 and to the output terminal of the crystal oscillator 5. Hereinafter, the outline of an operation of the transmitter-receiver constructed as stated hereinabove will be described.

First, at the time of a transmission, the PLL synthesizer oscillation circuit operates as a carrier oscillator. At that time, if a transmission signal is supplied to the signal input terminal 53, the transmission signal is fed to the VCO 4 of the PLL synthesizer oscillation circuit through the Gaussian filter 48. Thus the output carrier frequency of the PLL synthesizer oscillation circuit is modulated according to the transmission signal. A resultant modulated carrier wave signal is transmitted from an antenna through the amplifiers 49 and 51 and the transmitting filter 46, the power amplifier 47 and the transmit/receive switch 39 which is placed by the CPU 38 in the transmission position thereof.

Next, at the time of a reception, the PLL synthesizer oscillation circuit operates as a local oscillator. At that time, an RF reception signal received at the antenna is supplied to the frequency converter 42 through the transmit/receive switch 39 which is placed by the CPU 38 in the reception position thereof, the RF receiving amplifier 40 and the receiving filter 41. On the other hand, a local oscillation signal is similarly supplied to the frequency converter 42 from the PLL synthesizer oscillation circuit through the amplifiers 49 and 50. Thus, an intermediate frequency signal is obtained in the frequency converter 42 as a result of a frequency conversion performed on the RF reception signal by using the local oscillation signal. This intermediate frequency signal is supplied through the intermediate frequency filter 43 and the intermediate frequency amplifier 44 to the demodulator 45 whereupon the intermediate frequency signal is demodulated. Thereafter, the demodulated signal is supplied to the signal output terminal 52.

Further, the PLL synthesizer oscillation circuit constructed as described above operates as follows.

Namely, the PLL IC 1 compares the phase of a reference frequency signal, which is supplied from the crystal oscillator 5 to the incorporated PLL control circuit 36, with the phase of an oscillation frequency signal supplied thereto from the VCO 4 through the prescaler 35 and a variable frequency divider (not shown). Thereafter, the PLL IC 1 generates an error signal φp or φr according to the direction and magnitude of the difference between the phases of the two signals. Here, if the error signal φp is obtained, the pull-up PNP transistor 16 of the charge pump circuit 2 is turned on. Further, a voltage supplied from the charge pump feeding terminal 8 through the transistor 16 to the capacitor 18 of the loop filter 3 increases the voltage developed across between the terminals of the capacitor 18. This results in increase in output terminal voltage of the loop filter 3. Moreover, the increased voltage is supplied to the cathode of the variable capacitance diode 20 of the VCO 4. Consequently, the frequency of oscillation of the VCO 4 changes in a certain direction. In contrast, if the error signal φr is obtained, the pull-down NPN transistor 17 of the charge pump circuit 2 is turned on. Thus the capacitor 18 becomes connected through the NPN transistor 17 to the ground, so that the voltage developed across the terminals of the capacitor 18 is reduced from the charging voltage thereof. This results in decrease in output terminal voltage of the loop filter 3. Further, the decreased voltage is supplied to the cathode of the variable capacitance diode 20. Consequently, the frequency of oscillation of the VCO 4 changes in another direction. Moreover, the oscillation frequency signal is supplied from the output terminal of the VCO 4 to the PLL IC 1. Then, the aforementioned PLL frequency control operation is performed.

Meanwhile, in the case of the known transmitter-receiver, when being in the transmission state, the VCO functions as a carrier wave oscillator. Further, a digital signal to be transmitted is supplied to the VCO of the PLL oscillation circuit. Then, a frequency shift keying (hereunder abbreviated as FSK) modulation is performed on the oscillation signal of the VCO by using the digital signal. Thus an FSK modulation carrier wave signal is generated. In this case, the PLL oscillation circuit is constituted by a PLL of the high-speed lock type as described above. This has an ill influence in that when a digital signal having a relatively low frequency is input to the VCO, effects of the FSK modulation performed by use of the VCO is canceled by a frequency control signal of the PLL.

To eliminate this ill influence, in the case of the known transmitter-receiver, the generation of a frequency control signal is prevented by changing the state of the PLL into a stand-by state when the VCO is made to function as a carrier wave oscillator only at the time of a transmission. Thereby, during a period of time of a transmission time slot, the frequency of oscillation of the VCO is controlled according to the charging voltage of the loop filter.

FIG. 7 is a diagram for illustrating transmission and reception time slots assigned to a transmitter-receiver of the known cordless telephone system and for illustrating operating and stand-by states of the PLL of this transmitter-receiver.

As illustrated in FIG. 7, in the case of the known cordless telephone system, when the transmitter-receiver is in a time slot just preceding each of the transmission and reception time slots, the PLL thereof having been in a stand-by state until then is put into an operating state. Thereafter, when the transmission time slot comes, the state of the PLL is changed from the operating state to the stand-by state again to thereby eliminate the aforementioned ill influence. In contrast, when the reception time slot comes, the operating state of the PLL is maintained. Further, the state of the PLL is not changed from the operating state to the stand-by state until the end of the reception time slot.

However, in the case of the known cordless telephone system (of the TDMA/TDD type), the PLL is put in an operating state during the reception time slot in which the VCO functions as a local oscillator. Thus the power consumption of the PLL is large. Moreover, when the PLL is in an operating state, the leakage component of the reference frequency signal to be compared with the oscillation signal of the VCO is applied to the VCO through the loop filter. Further, reference spurious signals are sometimes generated at a frequency close to the frequency of oscillation of the VCO. However, the cut-off frequency of the loop filter can not be reduced because of the fact that the PLL is of the high-speed lock-up type. Consequently, the spurious characteristics of the PLL can not be improved. Furthermore, the known transmitter-receiver of the TDMA/TDD type has encountered various problems. For example, owing to the trade-off between the spurious characteristics and the lock-up time constant characteristics of the PLL, it takes much time and money to design the PLL in such a manner that both of the spurious characteristics and the lock-up time constant characteristics thereof can be improved.

Moreover, the known transmitter-receiver of the TDMA/TDD type has another problem in that the charging voltage of the capacitor 18 of the loop filter 3 varies serially due to leakage currents flowing through the charge pump circuit 2, the loop filter 3 and the VCO 4 in the period of time in which the synthesizing function of the PLL synthesizer oscillation circuit is in a dormant state. Further, the variation in the charging voltage is accompanied by the variation in the frequency of oscillation of the VCO 4. Furthermore, among the leakage currents, the leakage current flowing through the VCO 4 is much more than the leakage currents flowing through the VCO 4 and the loop filter 3. Consequently, the variation of the frequency of oscillation of the VCO 4 depends mainly on the leakage current flowing through the charge pump circuit 2.

FIGS. 5(a) to 5(c) are characteristic diagrams for illustrating examples of changes in the charging voltage of the capacitor 18 and in the frequency of oscillation of the VCO 4 in such a state. FIGS. 5(a), 5(b) and 5(c) illustrate the waveform of the power saving (PS) signal, the change in the charging voltage of the capacitor 18 and the variation in the frequency of oscillation of the VCO 4, respectively.

As illustrated in FIG. 5(a), when the power saving (PS) signal comes to have a low level "0" and the synthesizing function is put into a dormant state, the PLL is caused to be in an open state (namely, a released state). At that time, as illustrated in FIGS. 5(b) and 5(c), after the signal level of the power saving (PS) signal is changed into the low level "0", the charging voltage of the capacitor 18 comes to vary gradually. Consequently, the frequency of oscillation of the VCO 4 comes to vary serially. Thus the aforementioned problem is caused.

The present invention is accomplished to eliminate the aforesaid problems.

Accordingly, an object of the present invention is to provide a transmitter-receiver of the TDMA/TDD type which can reduce the power consumption thereof as much as possible and improve the spurious characteristics and insure sufficient frequency precision required of a communication apparatus of the TDMA type even in when the function of the PLL is a dormant state (namely, the PLL is in a stand-by state).

SUMMARY OF THE INVENTION

To achieve the foregoing object, in accordance with an aspect of the present invention as described in the appended claims, there is provided a TDMA/TDD type transmitter-receiver having a PLL (namely, a phase control loop) which includes at least a VCO (namely, a voltage-controlled oscillator) being adapted to act as a carrier oscillator when performing a transmissions and to act as a local oscillator when performing a reception and a loop filter. The PLL (namely, the phase control loop) is adapted to control a frequency of oscillation of the VCO (namely, the voltage-controlled oscillator). In this transmitter-receiver, the PLL (namely, the phase control loop) is closed during a period of a time slot just preceding a transmission time slot and during a period of a time slot just preceding a reception time slot. Further, the PLL (namely, the phase control loop) is opened during periods of the transmission and reception time slots. Moreover, when the loop is opened, the frequency of oscillation of the voltage-controlled oscillator is controlled according to a charging voltage of the loop filter.

Thus, in accordance with the present invention as described in the appended claims, when the period of a time slot just preceding each of the transmission and reception time slots assigned to the transmitter-receiver itself begins, the loop having been open is controlled in such a manner to be closed to put the PLL of the transmitter-receiver into an operating state. Moreover, when the transmission time slot or the reception time slot comes, the loop is controlled in such a manner to be opened to put the PLL into a stand-by state.

Further, in accordance with a second aspect of the present invention, there is provided a TDMA/TDD type transmitter-receiver which comprises a VCO (a voltage-controlled oscillator) having a variable voltage reactance element and being adapted to be able to change an output frequency thereof according to a control voltage supplied to one of electrodes of the variable voltage reactance element, a phase comparator for comparing a reference frequency signal with an output frequency signal of the VCO (namely, the voltage-controlled oscillator) and for generating error signals, state switching means for changing a state of the phase comparator between an operating state and a stand-by state in response to application of a changing signal and bias supply means for supplying a variable bias voltage to the other of the electrodes of the variable voltage reactance element. In the case of this transmitter-receiver, the bias supply means has an oscillation circuit for generating a variable bias voltage which varies in a nearly same manner as of variation of a control voltage supplied to the variable voltage reactance element, when the phase comparator is in a stand-by state.

Thus, in accordance with the second aspect of the present invention, when the PLL is in a stand-by state, namely, when the phase comparator is in a stand-by state, the variable bias voltage varying in nearly the same manner as of the variation of the control voltage (namely, the charging voltage of the capacitor of the loop filter) fed to an electrode of the variable voltage reactance element of the VCO (namely, the voltage-controlled oscillator) is supplied to the other electrode of the variable voltage reactance element. Thus, when the control voltage supplied to one of the electrodes of the variable voltage reactance element varies gradually owing to the leakage current with the lapse of time, the variable bias voltage fed to the other electrode of the variable voltage reactance element comes to gradually vary with time in the similar direction and range as of the variation in the control voltage.

Consequently, during a period in which the phase comparator is in a stand-by state, the voltage developed across the terminals of the variable voltage reactance element 20 does not vary as time passes. Thereby, the frequency of oscillation of the voltage-controlled oscillator (namely, the VCO) is maintained at a constant frequency during this period.

BRIEF DESCRIPTION OF THE DRAWINGS

Other features, objects and advantages of the present invention will become apparent from the following description of a preferred embodiment with reference to the drawings in which like reference characters designate like or corresponding parts throughout several views, and in which.

DETAILED DESCRIPTION OF THE PREFERRED EMBODIMENT

Figure 6:
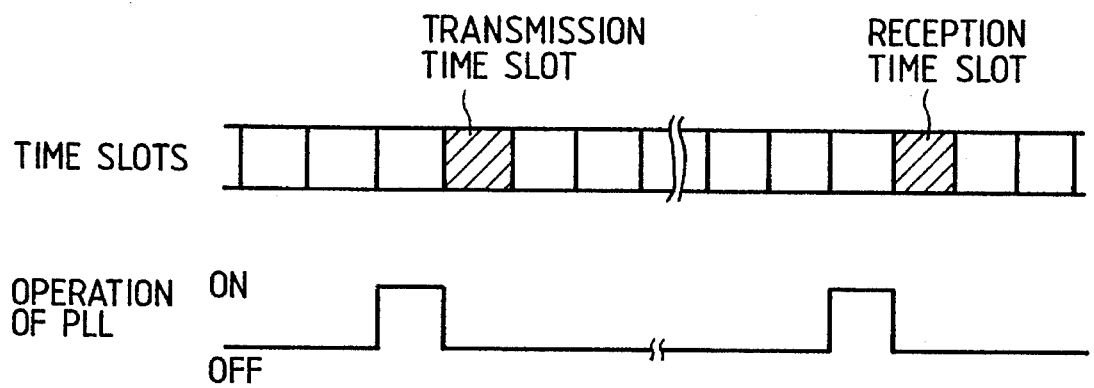
FIG. 6 is a diagram for illustrating transmission and reception time slots assigned to a transmitter-receiver of a cordless telephone system embodying the present invention and operating and stand-by states of a PLL of this transmitter-receiver.

Hereinafter, a preferred embodiment of the present invention will be described in detail by referring to the accompanying drawings. FIG. 6 is a diagram for illustrating transmission and reception time slots assigned to a transmitter-receiver of this embodiment of the present invention and for illustrating operating and stand-by states of a PLL of this transmitter-receiver.

Figure 7:
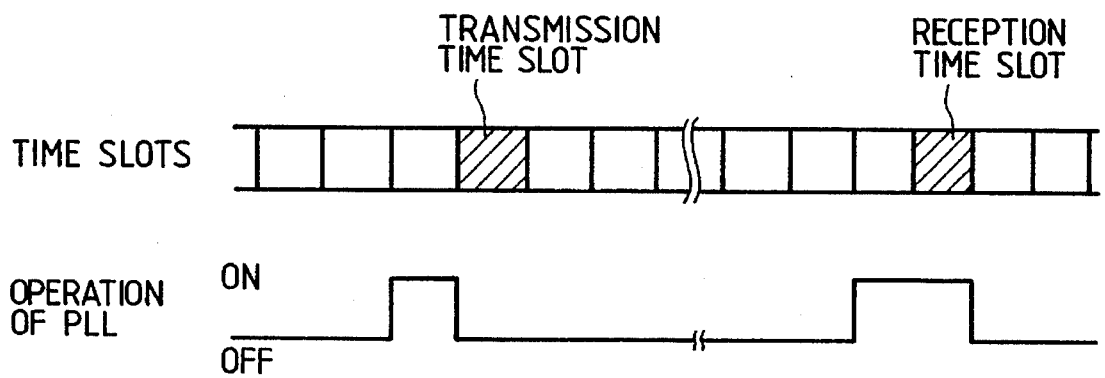
FIG. 7 is a diagram for illustrating transmission and reception time slots assigned to a transmitter-receiver of a known cordless telephone system and operating and stand-by states of a PLL of this transmitter-receiver.

As illustrated in FIG. 6, in the case of the known cordless telephone system, when the transmitter-receiver is in a time slot just preceding each of the transmission and reception time slots, the PLL thereof having been in a stand-by state until then is put into an operating state. Thereafter, when the transmission time slot comes, the state of the PLL is changed from the operating state to the stand-by state again. In this respect, this transmitter-receiver is similar to the known transmitter-receiver of FIG. 7. However, in the case of this embodiment, when the reception time slot comes, the state of the PLL is changed from the operating state to the stand-by state once again. In this respect, this embodiment is different from the known transmitter-receiver of the known transmitter-receiver of FIG. 7.

Figure 1:
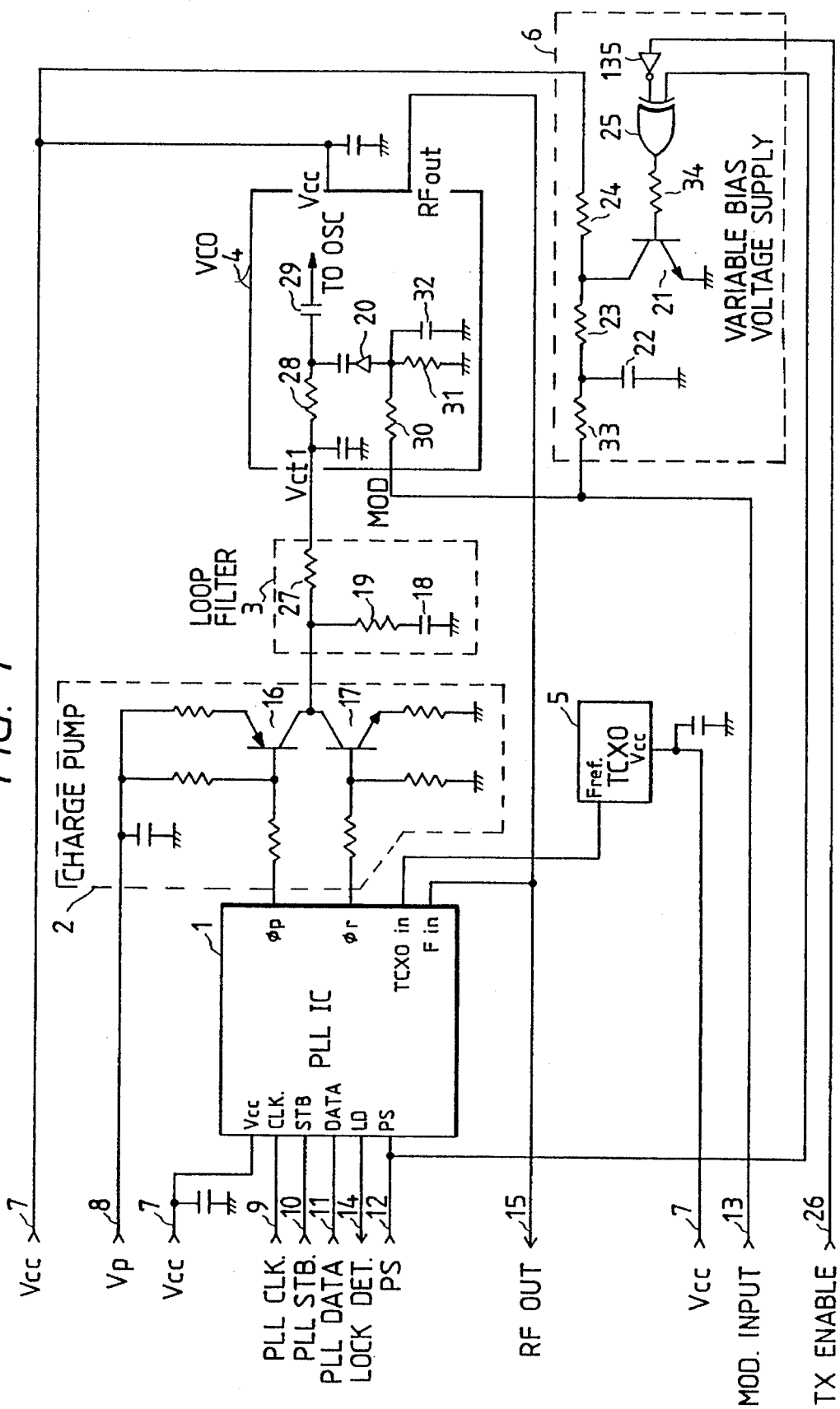
FIG. 1 is a circuit diagram for illustrating the configuration of an example of an oscillation circuit employed in a transmitter-receiver of the TDMA/TDD type embodying the present invention.

FIG. 1 is a circuit diagram for illustrating the configuration of an example of an oscillation circuit employed in the transmitter-receiver of the TDMA/TDD type embodying the present invention, in which the oscillation circuit composes a PLL synthesizer oscillation circuit.

In FIG. 1, reference numeral 1 designates a PLL IC (namely, a phase control loop integrated circuit); 2 a charge pump circuit; 3 a loop filter; 4 a VCO (namely, a voltage-controlled oscillator); 5 a crystal oscillator; 6 a variable bias voltage supply circuit (namely, bias supply means); 7 a power terminal; 8 a charge pump feeding terminal; 9 a PLL clock signal terminal; 10 a PLL strobe signal terminal; 11 a PLL data signal terminal; 12 a power saving signal terminal; 13 a modulation signal terminal; 14 a lock detection signal terminal; 15 an RF signal terminal; 16 a pull-up PNP transistor; 17 a pull-down NON transistor; 18 a first capacitor; 19 a first resistor; 20 a variable capacitance diode (namely, a variable voltage reactance element); 21 a switching transistor; 22 a second capacitor; 23 a second resistor; 24 a protective resistor; 25 an EOR (namely, an exclusive-OR) gate which satisfies a truth table of TABLE 1 listed below; 26 a transmission control signal (TX-ENABLE) terminal; 27, 28, 30 and 31 resistors; 29 and 32 capacitors; 34 a base current control resistor; and 135 an inverter.

TABLE 1

| | | | | |
|---|---|---|---|---|
| INPUT1 | 0 | 0 | 1 | 1 |
| INPUT2 | 0 | 1 | 0 | 1 |
| OUTPUT | 0 | 1 | 1 | 0 |

Figure 3:
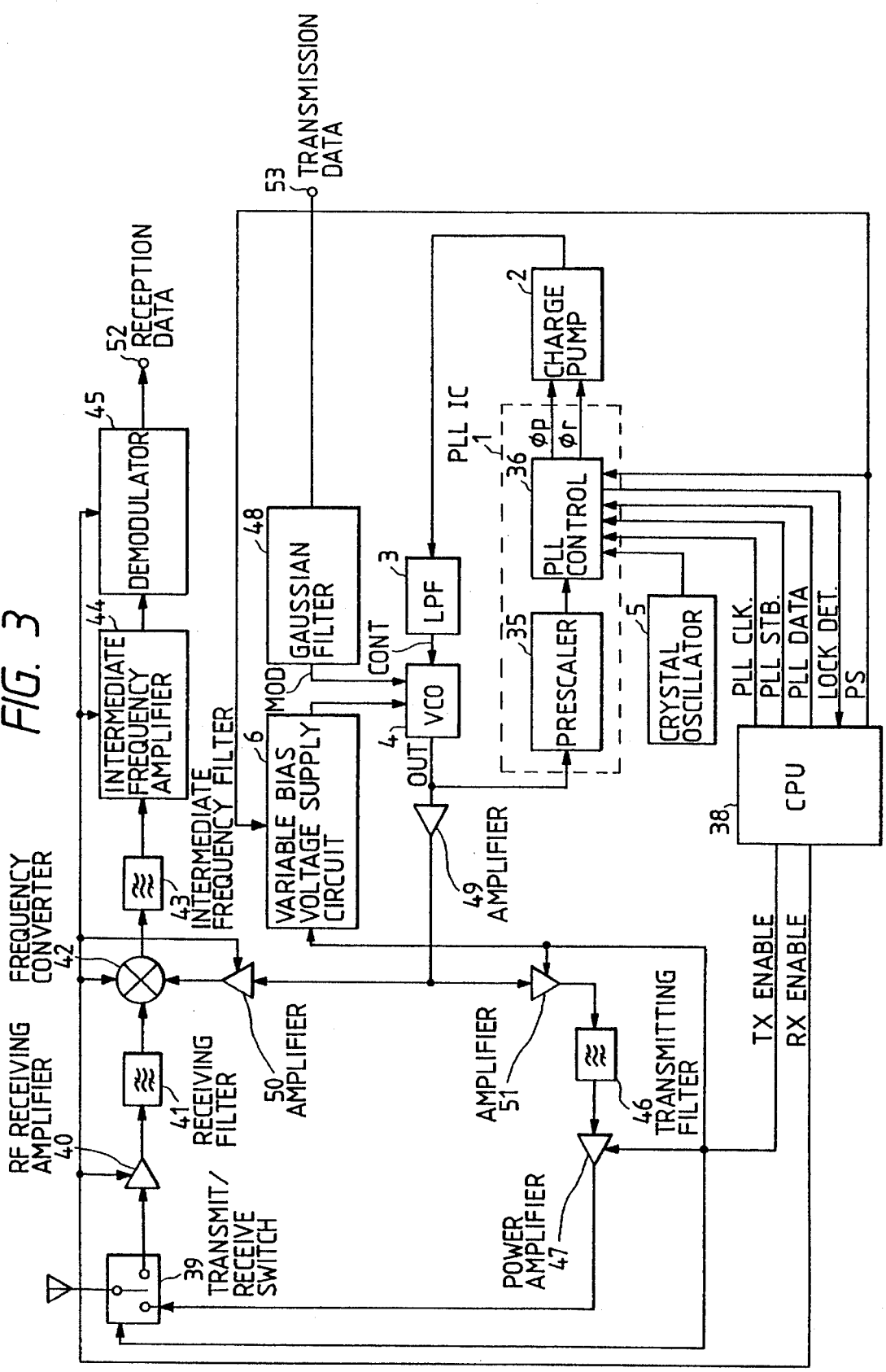
FIG. 3 is a schematic block diagram for illustrating the configuration of a transmitter-receiver of the TDMA/TDD type.
Figure 4:
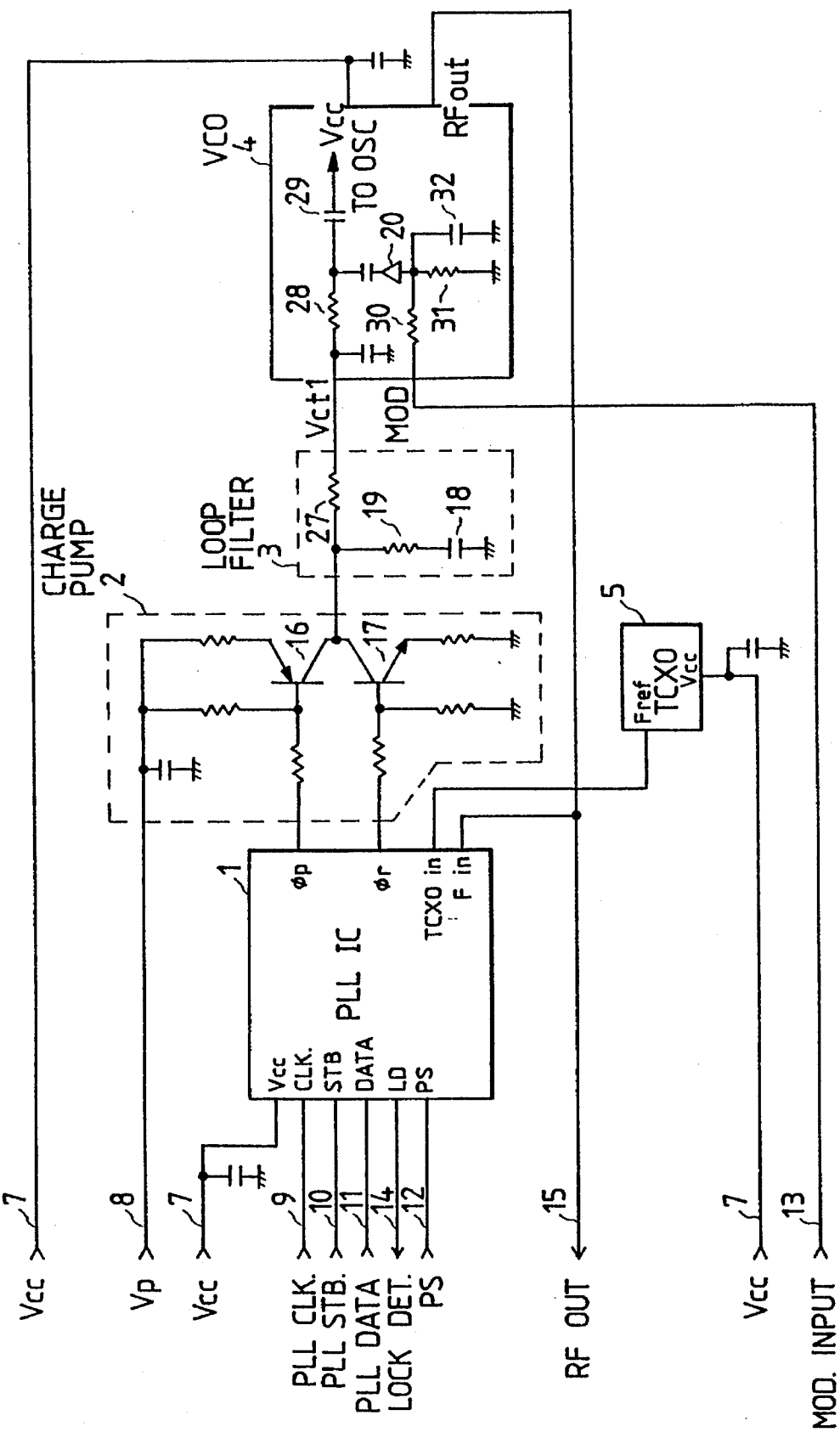
FIG. 4 is a circuit diagram for illustrating the detailed configuration of an example of an oscillation circuit employed in the transmitter-receiver of the TDMA/TDD type of FIG. 3.
Figure 5:
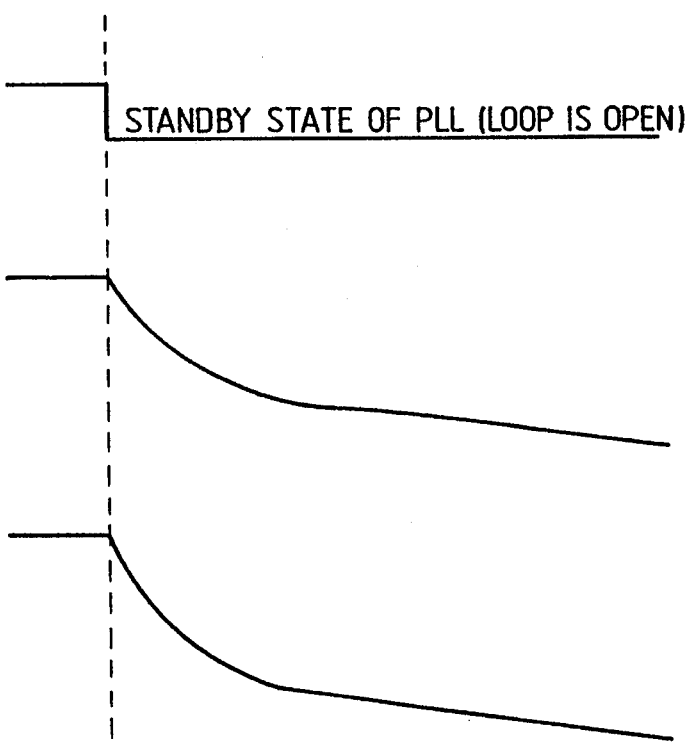
FIGS. 5(a) to 5(c) are characteristic diagrams for illustrating examples of changes in the charging voltage of a capacitor 18 and in the frequency of oscillation of the VCO of an oscillation circuit of a known transmitter-receiver of the TDMA/TDD type.

Further, the PLL synthesizer oscillation circuit of this embodiment, namely, of the transmitter-receiver of the TDMA/TDD type is substituted for the aforementioned PLL synthesizer oscillation circuit of the transmitter-receiver of FIG. 3. The PLL IC 1 contains a prescaler (not shown) and a PLL control circuit (not shown). Further, the PLL control circuit contains a phase comparator (not shown) for comparing the phase of a reference frequency signal supplied from the crystal oscillator 5 with that of an oscillation signal supplied from the VCO 4 through the prescaler and for generating error signals φp and φr. Here, a loop circuit portion consists of the PLL IC 1, the charge pump circuit 2, the loop filter 3 and the VCO 4 composes a PLL synthesizer oscillation circuit.

Moreover, the charge pump circuit 2 has the PNP transistor 16 and the NPN transistor 17 which are connected in series with each other between the charge pump feeding terminal 8 and the ground. The error signals φp and φr are supplied from the PLL control circuit to the bases of the transistors 16 and 17, respectively. Further, the connection point between the transistors 16 and 17 forms an output terminal. The loop filter 3 has the capacitor 18 and the resistor 19 which are connected in series with each other. One of terminals of this series circuit is connected to the output terminal of the charge pump circuit 2 and is also connected to the output terminal of the loop filter 3 through the series resistance or resistor 27. On the other hand, the other terminal of this series circuit is grounded. The VCO 4 has the variable capacitance diode 20. Further, the cathode of the diode 20 is connected to the oscillation circuit of the VCO 4 through the series resistor 28, the output terminal of the loop filter 3 and the series capacitor 29. On the other hand, the anode of the diode 20 is connected to the modulation signal terminal 13 through the resistor 30 and is further grounded through a parallel circuit composed of the resistor 31 and the capacitor 32. The PLL IC 1 is connected to the PLL clock signal terminal 9, the PLL strobe signal terminal 10, the PLL data signal terminal 11, the power saving signal terminal 12 and the lock detection signal terminal 14. Moreover, the PLL IC 1 is also connected to the RF signal terminal 15, the output terminal of the VCO 4 and the output terminal of the crystal oscillator 5. The variable bias voltage supply circuit 6 has the protective resistor 24 and the switching transistor 21 which are connected in series with each other between the power terminal 7 and the ground. A series circuit consisting of the second capacitor 22 and the second resistor 23 is connected to the switching transistor 21 in parallel. The base of the switching transistor 21 is connected to the output terminal of the EOR gate 25 through the base current control resistor 34. One of input terminals of the EOR gate 25 is connected to the transmission control signal (TX-ENABLE) terminal 26 through the inverter 135. The other of the input terminals of the EOR gate 25 is connected to the power saving signal terminal 12. Further, the connection point between the second capacitor 22 and the second resistor 23 is connected to the anode of the variable capacitance diode 20 through the resistors 33 and 30.

Figure 2:
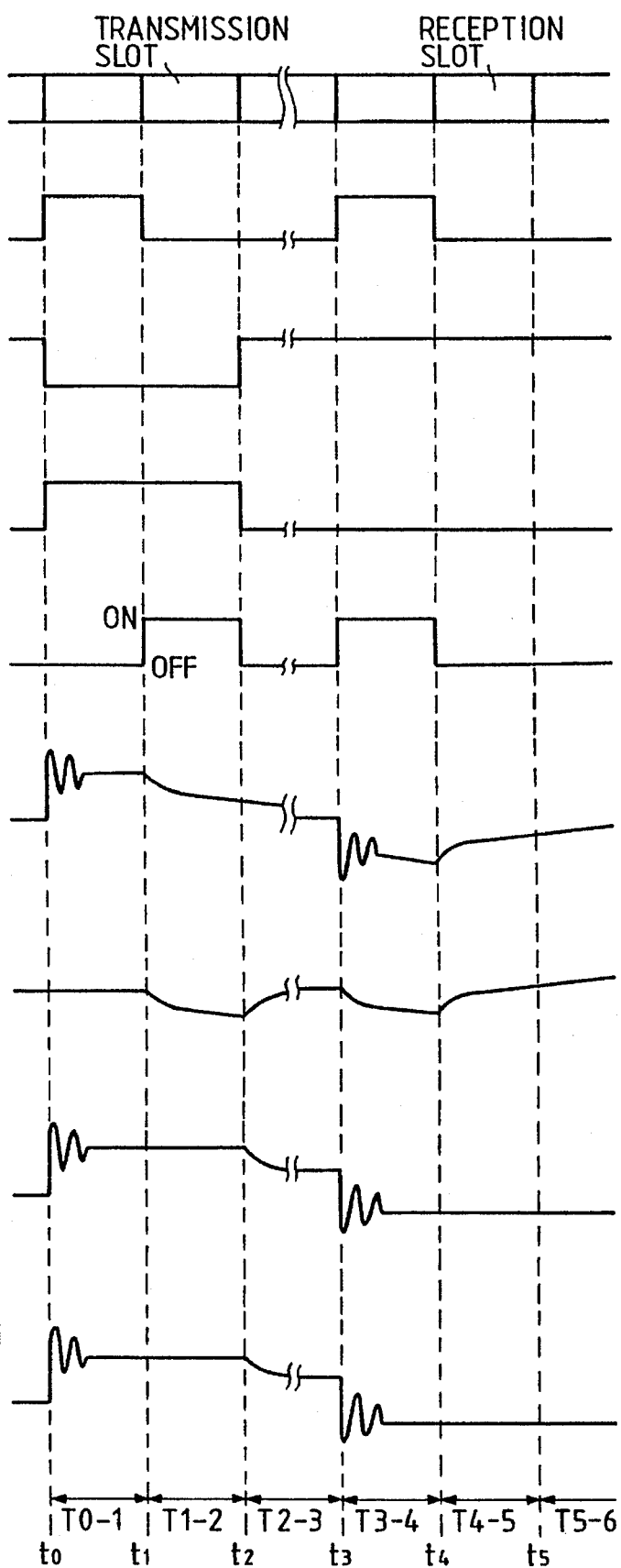
FIGS. 2(a) to 2(i) show characteristic diagrams for illustrating changes in states of various portions of the PLL synthesizer oscillation circuit of FIG. 1, which occur with the passage of time.

Next, FIGS. 2(*a*) to 2(*i*) are characteristic diagrams for illustrating the changes in states of various portions of the PLL synthesizer oscillation circuit of FIG. 1, which occur with the passage of time. FIG. 2(*a*) illustrates how the transmission and reception time slots assigned to this transmitter-receiver come; FIG. 2(*b*) the waveform of the power saving (PS) signal; FIG. 2(*c*) the waveform of the transmission control signal; FIG. 2(*d*) the waveform of an inversion signal representing the inversion of the transmission control signal; FIG. 2(*e*) the operating state of the switching transistor 21; FIG. 2(*f*) the variation in the cathode voltage of the variable capacitance diode 20; FIG. 2(*g*) the variation in the anode voltage of the variable capacitance diode 20; FIG. 2(*h*) the variation in the voltage developed across the terminals of the variable capacitance diode 20; and FIG. 2(*i*) the change in the frequency of oscillation of the VCO 4. In FIGS. 2(*a*) to 2(*i*), a period $T_{0-1}$ between moments $t_0$ and $t_1$ is the period of a time slot just preceding the transmission slot; a period $T_{1-2}$ between moments $t_1$ and $t_2$ is the period of the transmission slot; a period $T_{2-3}$ between moments $t_2$ and $t_3$ is the period of other slots; a period $T_{3-4}$ between moments $t_3$ and $t_4$ is the period of a time slot just preceding the reception slot; a period $T_{4-5}$ between moments $t_4$ and $t_5$ is the period of the reception slot; and a period $T_{5-6}$ between a moment $t_5$ and another moment $t_6$ (not shown), at which a time slot just preceding the next transmission time slot comes, is the period of other slots.

Hereinafter, an operation of this embodiment of the present invention will be described by referring to FIGS. 1 and 2(*a*) to 2(*i*).

In the case of this PLL synthesizer oscillation circuit, the synthesizing function is put into an operating state in each of the period $T_{0-1}$ of the slot just preceding the transmission slot and the period $T_{3-4}$ of the slot just preceding the reception slot. Namely, the state of the phase comparator of the PLL IC 1 is changed into an operating state. In contrast, the synthesizing function is put into a dormant state in the period $T_{1-2}$ of the transmission slot, the period $T_{4-5}$ of the reception slot and the periods $T_{2-3}$ and $T_{5-6}$ of the other slots. Namely, the state of the comparator is changed into a stand-by state.

First, when the moment $t_0$ comes and the period $T_{0-1}$ of the slot just preceding the transmission slot begins, the signal level of the power saving (PS) signal is changed or shifted from a low level "0" maintained until then to a high level "1" as illustrated in FIG. 2(*b*). This change results in that the phase comparator of the PLL control circuit of the PLL IC 1 becomes in an operating state. Consequently, the pull-up PNP transistor 16 is driven to conduction, so that the first capacitor 18 of the loop filter 3 is charged. Thereby, the cathode voltage of the variable capacitance diode 20 of the VCO 4 sharply rises from a holding voltage maintained until then to a high voltage as illustrated in FIG. 2(*f*). In a short time, the cathode voltage is converged onto a first voltage which is a constant voltage higher than the holding voltage. Until that time, the switching transistor 21 of the variable bias voltage supply circuit 6 has been maintained in an off-state as illustrated in FIG. 2(*e*). Thus the second capacitor 22 is charged up to the level of the source voltage Vcc from the power terminal 7 through the protective resistor 24 and the second resistor 23. Further, this voltage is supplied to the anode of the variable capacitance diode 20 through the resistors 33 and 30 as a bias voltage. Consequently, a transmission frequency control voltage, namely, the difference between the first voltage and a voltage of the second capacitor 22 is applied across the terminals of the variable capacitance diode 20 as illustrated in FIG. 2(*h*). Further, the VCO 4 oscillates at a frequency corresponding to this transmission frequency control voltage as illustrated in FIG. 2(*i*). Moreover, an oscillation signal is supplied from the output terminal thereof to both of the PLL IC 1 and the RF signal terminal 15.

Next, when the moment $t_1$ comes and the period $T_{1-2}$ of the transmission slot begins, the signal level of the power saving (PS) signal is changed from the high level "1" to the low level "0" as illustrated in FIG. 2(*b*). This change results in that the state of the phase comparator is changed from the operating state to the stand-by state. Then, both of the pull-up PNP transistor 16 and the pull-down NPN transistor 17 are put into a nonconducting state, so that the output impedance of the charge pump 2 becomes high. When being in this state, the first capacitor 18 is prevented from being charged. However, only the discharging thereof due to the leakage current is achieved. Thus the voltage of the first capacitor 18 comes to serially decrease from the first high voltage with the lapse of time. Further, as illustrated in FIG. 2(*f*), the cathode voltage of the variable capacitance diode 20 also comes to decrease serially or gradually with the lapse of time. Moreover, as illustrated in FIG. 2(*e*), correspondingly to the change in the state of the power saving (PS) signal, the signal level of the output signal of the EOR gate 25 is changed into a high level "1" and the state of the switching transistor 21 of the variable bias voltage supply circuit 6 is changed from an off-state maintained until then to an on-state. At that time, the second capacitor 22 of the variable bias voltage supply circuit 6 comes to be discharged serially through the second resistor 23 and the switching transistor 21. Thus the voltage of the second capacitor 22 decreases serially with the lapse of time. Consequently, as illustrated in FIG. 2(*g*), the anode voltage of the variable capacitance diode 20 similarly comes to decrease serially. Additionally, in the case of this embodiment, the resistance of the second resistor 23 of the variable bias voltage supply circuit 6 is adjusted in such a manner that the decrease in voltage of the second capacitor 22 becomes nearly equal to the decrease in the cathode voltage of the variable capacitance diode 20 due to the leakage current. Thus, as illustrated in FIG. 22(*h*), the voltage developed across the terminals of the variable capacitance diode 20 becomes equal to the transmission frequency control voltage applied thereto until then independent of voltage drops occurring in the first and second capacitors 18 and 22. In addition, such a voltage developed across the terminals of the variable capacitance diode 20 is maintained during the period $T_{1-2}$ of the transmission slot. As a result, the VCO 4 generates an oscillation signal having a frequency equal to the frequency of oscillation thereof occurring in the period $T_{0-1}$ of the time slot just preceding the transmission slot as illustrated in FIG. 2(i). Moreover, such an oscillation signal is kept generated during the period $T_{1-2}$ of the transmission slot.

Thereafter, when the moment $t_2$ comes and the period $T_{2-3}$ of another slot begins, the power saving (PS) signal is maintained at the low level "0". Thus the phase comparator is also maintained in the stand-by state. In contrast, the signal level of the inversion signal representing the inversion of the transmission control signal is shifted from the high level "1" to the low level "0". Moreover, the signal level of the output signal of the EOR gate 25 is shifted to the low level "0". It follows that the switching transistor 21 is put into an off-state once again. Thus the second capacitor 22 is charged at the source voltage Vcc through the protective resistor 24 and the second resistor 23. After a predetermined period of time has passed, the voltage of the second capacitor 22 rises to the level of the source voltage Vcc. This voltage is supplied to the anode of the variable capacitance diode 20. In contrast, the first capacitor 18 is not charged by the charge pump circuit 2 yet. Thus the voltage to be developed across the terminals of the variable capacitance diode 20 drops from the level of the transmission frequency control voltage applied during the period $T_{1-2}$ of the transmission slot by a voltage rise of the anode voltage.

Incidentally, in the period $T_{2-3}$ of other slots, such a voltage to be developed across the terminals of the variable capacitance diode 20 is applied thereto, so that the frequency of oscillation of the VCO 4 becomes different from that of oscillation thereof in the period $T_{1-2}$ of the transmission slot. This, however, does not affect the functions of the transmitter-receiver of this embodiment at all, because of the fact that the transmitter-receiver neither transmits nor receives a signal in the period $T_{2-3}$ of other slots.

Subsequently, when the moment $t_3$ comes and the period $T_{3-4}$ of the slot just preceding the reception slot begins, the signal level of the power saving (PS) signal is shifted from the low level "0" maintained until then to the high level "1" again, as illustrated in FIG. 2(b). This shift results in that the phase comparator becomes in an operating state. However, this time, the pull-down NPN transistor 17 of the charge pump circuit 2 is driven to conduction, so that the first capacitor 18 is discharged. Thereby, the cathode voltage of the variable capacitance diode 20 of the VCO 4 sharply drops from the holding voltage maintained until that time to a low voltage as illustrated in FIG. 2(f). Then, in a short time, the cathode voltage is converged onto a second voltage which is a constant voltage lower than the holding voltage. At that time, the discharging voltage of the second capacitor 22 is supplied to the anode of the variable capacitance diode 20. It follows from this that the reception frequency control voltage, namely, the difference between the second voltage and the discharging voltage is applied across the terminals of the variable capacitance diode 20 as illustrated in FIG. 2(g). Further, the VCO 4 oscillates at a frequency corresponding to this reception frequency control voltage as illustrated in FIG. 2(i). Moreover, an oscillation signal is supplied from the output terminal thereof to both of the PLL IC 1 and the RF signal terminal 15, similarly as in the aforementioned case.

Next, when the moment $t_4$ comes and the period $T_{4-5}$ of the reception slot begins, the signal level of the power saving (PS) signal is again shifted from the high level "1" to the low level "0" as illustrated in FIG. 2(b). This shift results in that the state of the phase comparator is changed from the operating state to the stand-by state again. Then, both of the pull-up PNP transistor 16 and the pull-down NPN transistor 17 are put into a nonconducting state, so that the output impedance of the charge pump 2 becomes high. When being in this state, the first capacitor 18 is prevented from being discharged. However, the charging thereof due to the leakage current is attained. Thus the voltage of the first capacitor 18 comes to serially rise from the second voltage with the lapse of time. Further, as illustrated in FIG. 2(f), the cathode voltage of the variable capacitance diode 20 also comes to rise serially or gradually with the lapse of time. Moreover, when the moment $t_4$ comes, the signal level of the output signal of the EOR gate 25 is shifted to the low level "0" correspondingly to the change in the state of the power saving (PS) signal. Further, the switching transistor 21 of the variable bias voltage supply circuit 6 is completely put in an off-state as illustrated in FIG. 2(e). At that time, the second capacitor 22 comes to be charged at the source voltage Vcc through the second resistor 23 and the protective resistor 24. Thus the voltage of the second capacitor 22 comes to rise serially from the voltage level thereof maintained until then with lapse of time. Consequently, as illustrated in FIG. 2(g), the anode voltage of the variable capacitance diode 20 similarly comes to rise serially. Additionally, in the case of this embodiment, the resistance of the second 23 and that of the protective resistor 24 are regulated in such a manner that the rise in voltage of the second capacitor 22 becomes nearly equal to the rise in the cathode voltage of the variable capacitance diode 20 due to the leakage current. Thus, as illustrated in FIG. 22(h), the voltage developed across the terminals of the variable capacitance diode 20 becomes equal to the reception frequency control voltage applied thereto until then independent of voltage rises occurring in the first and second capacitors 18 and 22. In addition, such a voltage developed across the terminals of the variable capacitance diode 20 is maintained during the period $T_{4-5}$ of the reception slot. As a consequence, the VCO 4 generates an oscillation signal having a frequency equal to the frequency of oscillation thereof occurring in the period $T_{3-4}$ of the time slot just preceding the reception slot as illustrated in FIG. 2(i). Moreover, such an oscillation signal is kept generated during the period $T_{4-5}$ of the reception slot.

Thereafter, when the moment $t_5$ comes and the period $T_{5-6}$ of other slots begins, the power saving (PS) signal is maintained at the low level "0". Thus the phase comparator is also maintained in the stand-by state. The switching transistor 21 is, however, in an off-state yet. Thus the second capacitor 22 comes to be kept charged through the protective resistor 24 and the second resistor 23. After a predetermined period of time has passed, the voltage of the second capacitor 22 rises to the level of the source voltage Vcc. This voltage is supplied to the anode of the variable capacitance diode 20. At that time, the first capacitor 18 is still being charged by the charge pump circuit 2. However, the charging by means of the charge pump 2 is stopped when the voltage of the loop filter 3 becomes approximately half the level of a charge pump feeding voltage Vp. Thus the voltage to be developed across the terminals of the variable capacitance diode 20 drops from the level of the reception frequency control voltage applied during the period $T_{1-2}$ of the transmission slot by a voltage rise of the anode voltage.

Incidentally, in the period $T_{5-6}$ of other slots, such a voltage to be developed across the terminals of the variable capacitance diode 20 is applied thereto, so that the frequency of oscillation of the VCO 4 becomes different from that of oscillation thereof in the period $T_{4-5}$ of the reception slot. This, however, does not affect the functions of the transmitter-receiver of this embodiment at all, because of the fact that the transmitter-receiver neither transmits nor receives a signal in the period $T_{5-6}$ of other slots.

As described above, in the case of the transmitter-receiver of the TDMA/TDD type of this embodiment, if the phase comparator of the PLL control circuit of the PLL IC 1 is in a stand-by state during the period $T_{1-2}$ of the transmission slot and the period $T_{4-5}$ of the reception slot, a variable bias voltage varying in the similar direction and range as of the variation of the frequency control voltage supplied to the cathode thereof is supplied to the anode of the variable capacitance diode 20 of the VCO 4. Thus the voltage to be developed across the terminals of the variable capacitance diode 20 is maintained at a constant level during such periods. Consequently, the frequency precision required of the transmitter-receiver of the TDMA type can be insured sufficiently.

As explained above, in the case of the transmitter-receiver of the TDMA/TDD type of the present invention, the PLL is put into an operating state only in the period of a time slot immediately preceding each of the transmission and reception time slots. Further, in the period of the reception time slot, the PLL is not put into an operating state but into a stand-by state.

Thus, in accordance with the present invention, the power is not consumed in the period of the reception time slot in which the PLL is in a stand-by state. Consequently, the present invention has advantages in that the power consumption of the PLL can be reduced and that a power-saving transmitter-receiver can be realized.

Further, owing to the aspect of the present invention that the PLL is put into a stand-by state during the period of the reception time slot, the present invention has effects that the leakage component of the reference frequency signal can be prevented from being supplied to the VCO 4 and that reference spurious signals can be prevented from being generated by the VCO 4.

Moreover, in the case of the transmitter-receiver of the present invention, when the PLL of the oscillation circuit is in a stand-by state, or when the phase comparator is in a stand-by state, the variable bias voltage varying in nearly the same manner as of the variation of the control voltage (namely, the charging voltage of the capacitor 18 of the loop filter 3) fed to an electrode of the variable voltage reactance element 20 of the VCO 4 is supplied to the other electrode of the variable voltage reactance element 20 by using the variable bias voltage supply circuit 6. Thus, when the control voltage supplied to one of the electrodes of the variable voltage reactance element 20 varies gradually owing to the leakage current with the lapse of time, the variable bias voltage fed to the other electrode of the variable voltage reactance element comes to gradually vary with time in the similar direction and range as of the variation in the control voltage.

Consequently, the voltage developed across the terminals of the variable voltage reactance element 20 does not vary as time passes. Hence, the present invention has advantages in that the frequency of oscillation of the VCO 4 is maintained at a constant frequency during a period in which the phase comparator is in a stand-by state and that the frequency precision required of the transmitter-receiver of the TDMA type can be sufficiently insured.

Although the preferred embodiment of the present invention has been described above, it should be understood that the present invention is not limited thereto and that other modifications will be apparent to those skilled in the art without departing from the spirit of the invention.

For example, in the case of the aforementioned embodiment of the present invention, a single variable capacitance diode 20 is employed as the variable voltage reactance element. The present invention is not limited to the transmitter-receiver employing a single variable capacitance diode. The combination of a plurality of variable capacitance diodes, the combination of a variable capacitance diode and another element, or an element similar to the variable capacitance diode may be employed as the variable voltage reactance element.

Moreover, the loop filter 3, the VCO 4 and the variable bias voltage supply circuit 6 of the present invention are not limited to those of the aforesaid embodiment illustrated in the accompanying drawings. Various modifications of such composing elements may be employed as long as the modifications do not change the functions of such elements.

Furthermore, the PLL IC 1 of the present invention is not limited to that of the aforementioned embodiment illustrated in the accompanying drawings. Apparently, each of the components of the PLL IC 1 may be replaced with another circuit.

The scope of the present invention, therefore, is to be determined solely by the appended claims.

What is claimed is:

1. A TDMA/TDD type transmitter-receiver for performing a signal transmission operation and a signal reception operation during each of a plurality of time frames, each time frame including a plurality of time slots having a common length, the signal transmission operation occurring during a transmission time slot and the signal reception operation occurring during a reception time slot of each time frame, wherein the transmission time slot and the reception time slot are separated by at least one time slot during which the transmitter-receiver performs neither of the signal transmission operation and the signal reception operation, the transmitter-receiver comprising a PLL synthsizer oscillator circuit which includes at least a PLL control circuit, a voltage-controlled oscillator and a loop filter, wherein the voltage-controlled oscillator generates an output signal having a first frequency when performing the signal transmission operation and having a second frequency when performing the signal reception operation, wherein the PLL control circuit is responsible for a control voltage through the loop filter supplied to the voltage-controlled oscillator, the control voltage having a first voltage level during the signal transmission operation and a second voltage level during the signal reception operation, wherein the PLL control circuit is closed during a first period of a time just preceding the transmission time slot and during a second period of a time just preceding the reception time slot, wherein the PLL control circuit is opened during the transmission and reception time slots, and wherein during the transmission and reception time slots, a frequency of oscillation of the voltage-controlled oscillator is controlled by a voltage level stored by the loop filter.

2. The TDMA/TDD type transmitter-receiver according to claim 1, wherein the PLL synthesizer oscillator circuit is of a high-speed lock-up type.

3. A TDMA/TDD type transmitter-receiver comprising:

a voltage-controlled oscillator having a variable voltage reactance element and being adapted to change a frequency of an output signal of the voltage-controlled oscillator in response to a control voltage supplied to a first electrode of the variable voltage reactance element;

a phase comparator for comparing a reference frequency signal with the output signal of the voltage-controlled oscillator and for generating error signals;

state switching means for changing a state of the phase comparator between an operating state and a stand-by state in response to application of a changing signal, wherein the error signals are generated by the phase comparator only when the phase comparator is in the operating state; and bias supply means for supplying a variable bias voltage to a second electrode of the variable voltage reactance element, wherein the bias supply means generates the variable bias voltage which varies in a nearly same manner as a variation of the control voltage supplied to the variable voltage reactant element when the phase comparator is in the stand-by state.

4. The TDMA/TDD type transmitter-receiver according to claim 3, wherein the bias supply means comprises:

a switching transistor having a collector connected to a power source through a protective resistor, an emitter connected to ground and a base to which a switching signal is supplied, thereby being driven to be on or off; and a second resistor and a capacitor which are connected in series, the second resistor and capacitor being connected to the collector of the switching transistor, wherein when the switching transistor is off, the capacitor is charged through the second resistor, and wherein when the switching transistor is on, the charged capacitor is discharged through the second resistor and the switching transistor.

5. The TDMA/TDD type transmitter-receiver according to claim 4, wherein the switching signal supplied to the base of the switching transistor is a binary signal consisting of the changing signal supplied to the phase comparator and a transmission control signal.

6. The TDMA/TDD transmitter-receiver according to claim 5, wherein the variable voltage reactance element is composed of a variable capacitance diode, wherein the one of the electrodes and the other thereof are a cathode and an anode of the variable voltage reactance element, respectively.

7. The TDMA/TDD type transmitter-receiver according to claim 3, wherein the variable voltage reactance element is composed of a variable capacitance diode, wherein the one of the electrodes and the other thereof are a cathode and an anode of the variable voltage reactance element, respectively.

* * * * *